(12) United States Patent
Howe

(10) Patent No.: US 6,944,079 B2
(45) Date of Patent: Sep. 13, 2005

(54) DIGITAL SWITCHING TECHNIQUE FOR DETECTING DATA

(75) Inventor: Gary L. Howe, Plano, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/750,736

(22) Filed: Dec. 31, 2003

(65) Prior Publication Data

US 2005/0141308 A1 Jun. 30, 2005

(51) Int. Cl.[7] ............................................. G11C 7/02
(52) U.S. Cl. .................................. 365/207; 365/189.05
(58) Field of Search ........................ 365/207, 233, 365/189.05, 230.08, 189.08

(56) References Cited

U.S. PATENT DOCUMENTS

| | | | | |
|---|---|---|---|---|
| 5,373,473 A | * | 12/1994 | Okumura | 365/208 |
| 6,005,816 A | * | 12/1999 | Manning et al. | 365/208 |
| 6,356,487 B1 | * | 3/2002 | Merritt | 365/189.05 |
| 6,430,606 B1 | | 8/2002 | Haq | 709/208 |
| 6,483,347 B1 | * | 11/2002 | Baker | 326/82 |
| 6,513,080 B1 | | 1/2003 | Haq | 710/107 |

OTHER PUBLICATIONS

JAZiO, Inc., "JAZiO High Speed Digital I/O Signal Switching Technology", Published Jul. 20, 2000.

* cited by examiner

Primary Examiner—Thong Q. Le
(74) Attorney, Agent, or Firm—Fletcher Yoder

(57) ABSTRACT

The present technique relates to a method and apparatus for detecting a change in a data signal at a buffer device. In the buffer device, first stage comparators may be adapted to receive a data signal and either a first voltage timing reference (VTR) signal or a complimentary VTR signal. The first stage comparators may each deliver an output signal to second stage comparators. Each of the second stage comparators receives the output signal from each of the first stage comparators. From the first stage comparator signals, the second stage comparators produce an output signal, such as a first output signal and a second output signal. These output signals from the second stage comparators are differential signals.

37 Claims, 8 Drawing Sheets

DIGITAL SWITCHING TECHNIQUE FOR DETECTING DATA

BACKGROUND OF THE INVENTION

1. Field of the Invention

The present invention relates generally to semiconductor devices and, more particularly, to a digital switching technique for detecting data on a semiconductor device, such as a memory device.

2. Description of the Related Art

This section is intended to introduce the reader to various aspects of art, which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, telephones, control systems, networks, and a host of consumer products. Microprocessors are essentially generic devices that perform specific functions under the control of a software program. This program is stored in a memory device, such as dynamic random access memories (DRAMs), static random access memories (SRAMs) or other suitable types of memories that are coupled to the microprocessor. Not only does the microprocessor access memory devices to retrieve program instructions, but it also stores and retrieves data created during the execution of the program in one or more memory devices. It should be understood that memory devices and microprocessor-controlled integrated circuits are typically mass produced through fabrication processes that form semiconductor chips.

In fabricating a semiconductor chip, different materials are layered together to form various structures or circuitry. These structures may enable the exchange of data signals between semiconductor chips and other devices. One structure that may be formed in the semiconductor chip is a signal switching structure that may be used to detect changes in data signals. These signal switching structures may be implemented in a variety of devices, such as DRAMs, SRAMs, memory buses, processors, network processors, application specific integrated circuits (ASICs), and intra-chip buses. As such, the signal switching structures may be utilized to enhance the operation of the device.

Constraints on cost, physical space and operating speeds continue to drive enhancements in the design of the signal switching structures in semiconductor devices. One signal switching design, which may be implemented, may utilize a data pin along with a complimentary data pin to provide data sensing. By utilizing two pins to detect data signals, this switching technique increases the overall cost of the semiconductor chips because of the additional pin that is used in detecting the data signal. An alternative signal switching design uses a single data pin along with a fixed reference voltage. Disadvantageously, this fixed reference signal switching technique operates slower, because the signal sensing depends on the crossing of a reference voltage. Another alternative signal switching design uses a single data pin along with two voltage timing reference (VTR) signals to provide faster sensing of changes in the data signal. This approach provides for faster data sensing because one of the VTR signals is complimentary to the data signal. However, it may have problems with feedback timing issues and may fail to provide symmetric signals. This means that the data sensing window, which is the voltage and time period that a receiver may detect the data signal, has to be larger to compensate for these problems. As such, each of the forgoing signal switching techniques has drawbacks associated therewith.

Due to the ever-increasing demands for smaller structures and faster data signal sensing, the processing of such signal switching structures is often costly and complex. Thus, providing higher performance data sensing structures that minimize the timing and symmetry issues would be advantageous.

BRIEF DESCRIPTION OF THE DRAWINGS

The foregoing and other advantages of the present technique may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
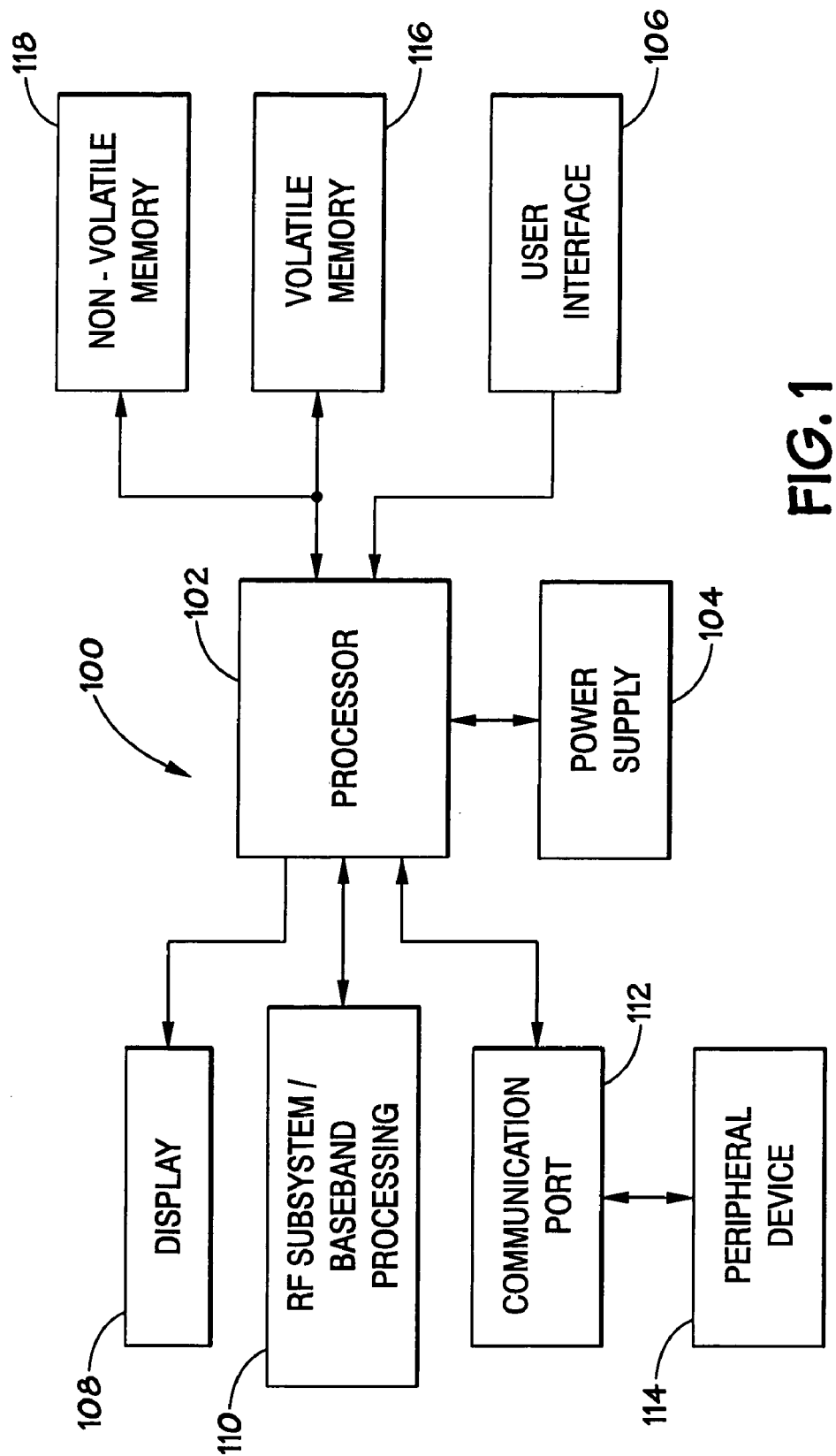
FIG. 1 illustrates a block diagram of an exemplary processor-based device in accordance with the present technique.

Turning now to the drawings, and referring initially to FIG. 1, a block diagram depicting an exemplary processor-based device, generally designated by the reference numeral 100, is illustrated. The device 100 may be any of a variety of different types, such as a computer, pager, cellular telephone, personal organizer, control circuit, etc. In a typical processor-based device, a processor 102, such as a microprocessor, controls many of the functions of the device 100.

The device 100 typically includes a power supply 104. For instance, if the device 100 is portable, the power supply 104 may include permanent batteries, replaceable batteries, and/or rechargeable batteries. The power supply 104 may also include an A/C adapter, so that the device may be plugged into a wall outlet, for instance. In fact, the power supply 104 may also include a D/C adapter, so that the device 100 may be plugged into a vehicle's cigarette lighter, for instance.

Various other devices may be coupled to the processor 102, which may depend upon the functions that the device 100 performs. For instance, a user interface 106 may be coupled to the processor 102 to allow a user to enter data into the device 100. The user interface 106 may include buttons, switches, a keyboard, a light pen, a mouse, and/or a voice recognition system, for instance. A display 108 may also be coupled to the processor 102 to present the user with information. The display 108 may include an LCD display, a CRT, LEDs, and/or an audio display. Furthermore, an RF subsystem/baseband processor 110 may also be coupled to the processor 102 to communicate with other devices through a wireless link. The RF subsystem/baseband processor 110 may include an antenna that is coupled to an RF receiver and to an RF transmitter (not shown). Also, a communication port 112 may be coupled to the processor 102 for addition communication with other devices through a physical link. The communication port 112 may be adapted to be coupled to a peripheral device 114, such as a modem, a printer, or a computer, for instance.

Because the processor 102 controls the functioning of the device 100, which is generally under the control of software programming, memory is coupled to the processor 102 to store and facilitate execution of the program. For instance, the processor 102 may be coupled to volatile memory 116, which may include dynamic random access memory (DRAM) and/or static random access memory (SRAM), for instance. The amount of DRAM and SRAM may depend on the specific design of the device 100. The processor 102 may also be coupled to non-volatile memory 118. The non-volatile memory 118 may include read only memory (ROM), such as an erasable programmable ROM (EPROM), to be used in conjunction with the volatile memory 116. The size of the ROM is typically selected to be just large enough to store any necessary operating system, application programs, and fixed data. The volatile memory 116, on the other hand, is typically quite large so that it can store dynamically loaded applications. Additionally, the non-volatile memory 118 may include a high capacity memory, such as a disk or tape drive memory.

The processor-based device 100 may include numerous semiconductor chips in the various components that are utilized to provide the functionality to the device 100. For instance, the volatile memory 116 and the non-volatile memory 118 may be semiconductor chips that are coupled to the processor-based device 100 to store the software programming for the operation of the processor-based device 100. The semiconductor chips may exchange signals between each other and other components of the device 100 to perform their respective functions. As such, improvements in each of the semiconductor chips may improve the efficiency of the processor-based device 100 and provide reliable access to the information stored in the volatile memory 116 and the non-volatile memory 118. A memory device, such as the volatile memory 116, is explained in greater detail in FIG. 2.

Figure 2:
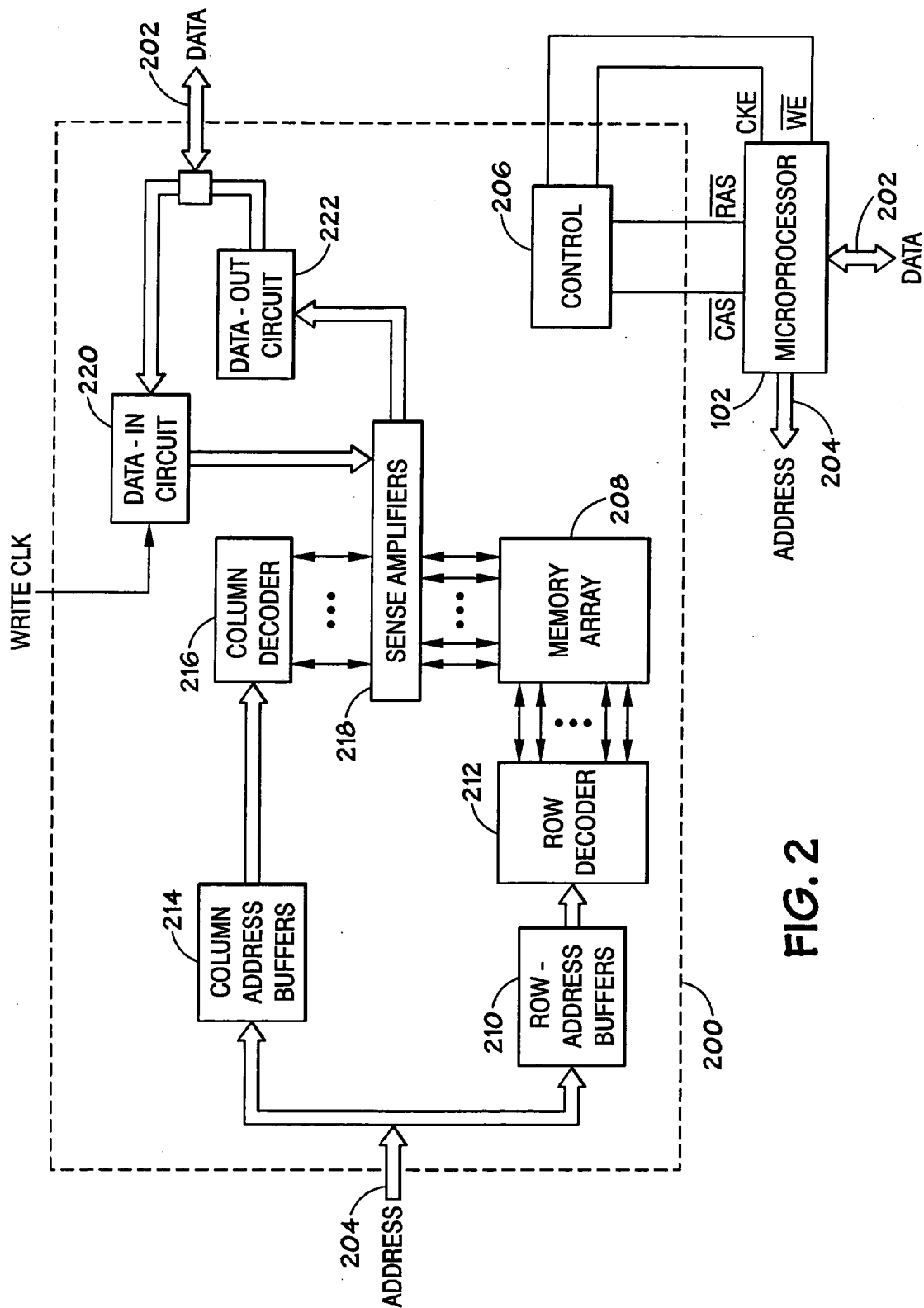
FIG. 2 illustrates a block diagram of an exemplary memory device in the processor-based device of FIG. 1.

Turning now to FIG. 2, a block diagram depicting an exemplary embodiment of a memory device is illustrated. The description of the memory device 200 has been simplified for illustrative purposes and is not intended to be a complete description of all features in a memory device. Likewise, the present technique may not be limited to a memory device 200 being SRAMs or DRAMs, but may be applicable to other devices, such as memory buses, processors, network processors, ASICs, and intra-chip buses, which may benefit from digital signal switching that reduces feedback timing issues and provides additional gain. As such, various devices may implement the present technique.

During operation, the memory device 200 may receive various inputs that are utilized by various circuits within the memory device 200. For instance, individual inputs, such as control information, address information, and data, may be provided over a memory bus to the memory device 200. These individual representations of inputs are illustrated by a data bus or lines 202, address lines 204, and various discrete lines directed to control logic 206. The memory device 200 includes a memory array 208, which comprises rows and columns of addressable memory cells. To provide access to the memory cells, each memory cell in a row is coupled to a word line. Additionally, each memory cell in a column is coupled to a bit line. The word line and bit line may be utilized to access, a storage capacitor through an access transistor in the memory array 208, for instance.

The memory device 200 interfaces with, for example, a processor 102, such as a microprocessor, through address lines 204 and data lines 202. Alternatively, the memory device 200 may interface with other devices, such as a memory controller, a microcontroller, a chip set, or another electronic system. The processor 102 may also provide a number of control signals to the memory device 200. Such control signals may include row and column address strobe signals RAS and CAS, a write enable signal WE, a clock enable signal CKE, and other conventional control signals. The control logic 206 controls many available functions of the memory device 200. In addition, various other control circuits and signals not detailed herein contribute to the operation of the memory device 200.

Row-address buffers 210 and a row decoder 212 receive and decode row addresses from row address signals provided on the address lines 204. Each unique row address corresponds to a row of cells in the memory array 208. The row decoder 212 typically includes a word line driver, an address decoder tree, and circuitry which translates a given row address received from the row-address buffers 210 and selectively activates the appropriate word line of the memory array 208 via the word line drivers.

A column address buffer 214 and a column decoder 216 receive and decode column address signals provided on the address lines 204. The column decoder 216 may also determine when a column is defective, as well as the address of a replacement column. The column decoder 216 is coupled to sense amplifiers 218. The sense amplifiers 218 are coupled to complimentary pairs of bit lines of the memory array 208, for example.

The sense amplifiers 218 are coupled to data-in (i.e., write) circuitry 220 and data-out (i.e., read) circuitry 222. The data-in circuitry 220 and the data-out circuitry 222 include data drivers and latches. During a write operation, the data bus 202 provides data to the data-in circuitry 220. The sense amplifier 218 receives data from the data-in circuitry 220 and stores the data in the memory array 208 as a charge on a capacitor of a cell at an address specified on the address lines 204.

During a read operation, the memory device 200 transfers data to the processor 102 from the memory array 208.

Complimentary bit lines for the accessed cell are equilibrated during a precharge operation to a reference voltage provided by an equilibration circuit and a reference voltage supply. The charge stored in the accessed cell is then shared with the associated bit lines. The sense amplifier 218 detects and amplifies a difference in voltage between the complimentary bit lines. Address information received on address lines 204 selects a subset of the bit lines and couples them to complimentary pairs of input/output (I/O) wires or lines. The I/O wires pass the amplified voltage signals to the data-out circuitry 222 and eventually to the data bus 202. The data-out circuitry 222 may include a data driver (not shown) to drive data out onto the data bus 202 in response to a read request directed to the memory array 208. Further, the data-out circuitry 222 may include a data latch (not shown) to latch the read data until it is driven onto the data bus 202 by the data driver.

In exchanging data, the column-address buffers 214, the row-address buffers 210, the data-in circuitry 220 and the data-out-circuitry 222 may utilize digital signal switching techniques to transmit and receive data between various components. These digital signal switching techniques may utilize multiple pins, such as a pin for the data bit and its compliment. However, as discussed above, the multiple pin solution is not cost effective because of the increased cost associated with providing the additional pin. As can be appreciated, there is a further disadvantage associated with the additional space utilized on the semiconductor chip for the additional pins. As such, a single pin per data bit solution may be advantageous because of the reduced space utilized and the cost savings.

A single pin signal switching technique, such as the JAZiO™ digital signal switching technique, utilizes differential sensing to provide digital switching with a single pin per data bit. With the single pin signal switching technique, voltage timing reference (VTR) signals are utilized with a data signal to detect changes in the data signal. The single pin signal switching technique detects the data signal during a transition, which may enable faster operation, reduce hold and setup times, and reduce noise related issues. In some situations, a single pin signal switching structure may use steering logic to determine which of two comparators has a stronger signal to provide the output for the single pin signal switching structure. However, the steering logic may introduce timing issues because the steering logic is delayed in selecting the signal that is to be provided as an output. As such, the steering logic may select the weaker signal, which results in false data being provided as an output.

In contrast to the steering logic design, a single pin signal switching technique may be implemented without steering logic to resolve the timing feedback issues. For instance, a single pin signal switching technique without steering logic, such as a single stage JAZiO™ current summing amplifier, may be utilized to perform the digital signal switching. However, this technique may introduce problems that relate to the symmetry of the VTR signals with respect to the data. For instance, if the data signal changes consistently, then the single pin signal switching structure may sense the data signal within a specified window. However, if the data remains unchanged for a period of time, then the single pin signal switching structure may have symmetry issues. As a result, the sensing window, which is the voltage and time period that a receiver may detect the data signal, has to be larger for the single pin signal switching structure without steering logic to compensate for this lack of symmetry. The lack of symmetry may include signals crossing at a point that is later in time than expected or at a voltage that is higher or lower than expected. As such, each of the switching techniques presents different problems, which may exhibit symmetry and/or timing issues.

To provide higher performance data sensing, a switching structure or device may minimize the timing and symmetry issues. The switching device 300 may provide a switching scheme that is symmetric with respect to data input logic states because the signals within the switching device are differential. In addition, the lack of steering logic minimizes the timing feedback issues present in other techniques. The switching device, which may be implemented in column-address buffers 214, row-address buffers 210, data-in circuit 220 and/or data-out-circuit 222, is described in greater detail with reference to FIG. 3.

In a first stage of the switching device 300, a data signal DATA, a VTR signal VTR1, and a complimentary VTR signal VTR2 are provided to the input terminals of four comparators 302, 304, 306, and 308, which may be differential amplifiers. The data signal DATA, which may be associated with control information, address information, or data, is provided to a positive terminal of the first comparator 302, the positive terminal of the second comparator 304, a negative terminal of the third comparator 306, and a negative terminal of the fourth comparator 308. The VTR signal VTR1 is provided to a negative terminal of the first comparator 302 and a positive terminal of the third comparator 306. The complimentary VTR signal VTR2 is provided to a negative terminal of the second comparator 304 and a positive terminal of the fourth comparator 308. The VTR signals VTR1 and VTR2 may be a pair of alternating voltage and timing reference signals that are compliments of each other.

Because the VTR signals VTR1 and VTR2 are complimentary, the data signal DATA is opposite in magnitude of one of the VTR signals VTR1 and VTR2 during each cycle. With the data signal DATA being different from one of the VTR signals VTR1 and VTR2, two of the comparators 302, 304, 306, and 308 may produce output signals that indicate a difference exists between the two signals received at the inputs of two of the comparators 302, 304, 306, and 308. In contrast, the other two comparators 302, 304, 306, and 308 may produce output signals that indicate that no difference exists between the two signals received at the inputs of the other two of the comparators 302, 304, 306, and 308. For instance, each of the comparators 302, 304, 306, and 308 produces a single output signal. If the data signal DATA and the VTR signal VTR1 are approximately the same, then the output of the first comparator 302 and the output of the third comparator 306 may be relatively equal, while the output of the second comparator 304 and the output of the fourth comparator 308 may be different from each other. Similarly, if the data signal DATA and complimentary VTR signal VTR2 are approximately equal, then the outputs of the second comparator 304 and fourth comparator 308 are approximately equal, while the outputs of the first comparator 302 and the third comparator 306 are different from each other.

In a second stage of the switching device 300, the outputs of the comparators 302. 304, 306, and 308 are coupled to a first two-channel comparator 310 and a second two-channel comparator 312. The first two-channel comparator 310 has two positive terminals coupled to outputs of the first comparator 302 and second comparator 304 along with two negative terminals coupled to outputs of the third comparator 306 and the fourth comparator 308. The first two-channel comparator 310 provides an output signal OUTPUT1. The second two channel comparator 312 has two positive terminals connected to the third comparator 306 and the fourth comparator 308 along with two negative terminals connected to the first comparator 302 and the second comparator 304. The second two-channel comparator 312 provides an output signal OUTPUT2. By using the outputs of the comparators 302, 304, 306, and 308 in this configuration, the signals that are approximately equal from the comparators 302, 304, 306, and 308 are filtered out through the second stage of the switching device 300. As a result, the output signals OUTPUT1 and OUTPUT2 form complimentary signals, which are differential signals, produced from the two-channel comparators 310 and 312. The operation and interaction of the first and second stages are further described with reference to the timing diagrams in FIGS. 4A–4D.

Each of FIGS. 4A–4D illustrates a group of graphs depicting voltage verses time for the different outputs resulting from a specific combination of a data signal DATA and VTR signals VTR1 and VTR2 being applied to the switching device 300 after a time T. FIGS. 4A–4D may be best understood in conjunction with FIG. 3. In each of the graphs, the signal being "high" may be referenced as a "1," while the signal being low may be referenced by a "0." Also, a first voltage source $V_{cc}$ may be a voltage source of higher potential, such as 5 volts, while a second voltage source $V_{ss}$ may be a voltage source of lower potential than the first voltage source $V_{cc}$, such as ground. It should be noted that each of the graphs include the voltage sources $V_{cc}$ and $V_{ss}$, which may be the voltage sources $V_{cc}$ and $V_{ss}$ or a percentage of the voltage sources $V_{cc}$ and $V_{ss}$, depending on the specific design of the switching device 300. As such, FIGS. 4A–4D may further describe the operation of the comparators 302, 304, 306, and 308 and the two-channel comparators 310 and 312 of the switching device 300.

Figure 4A:
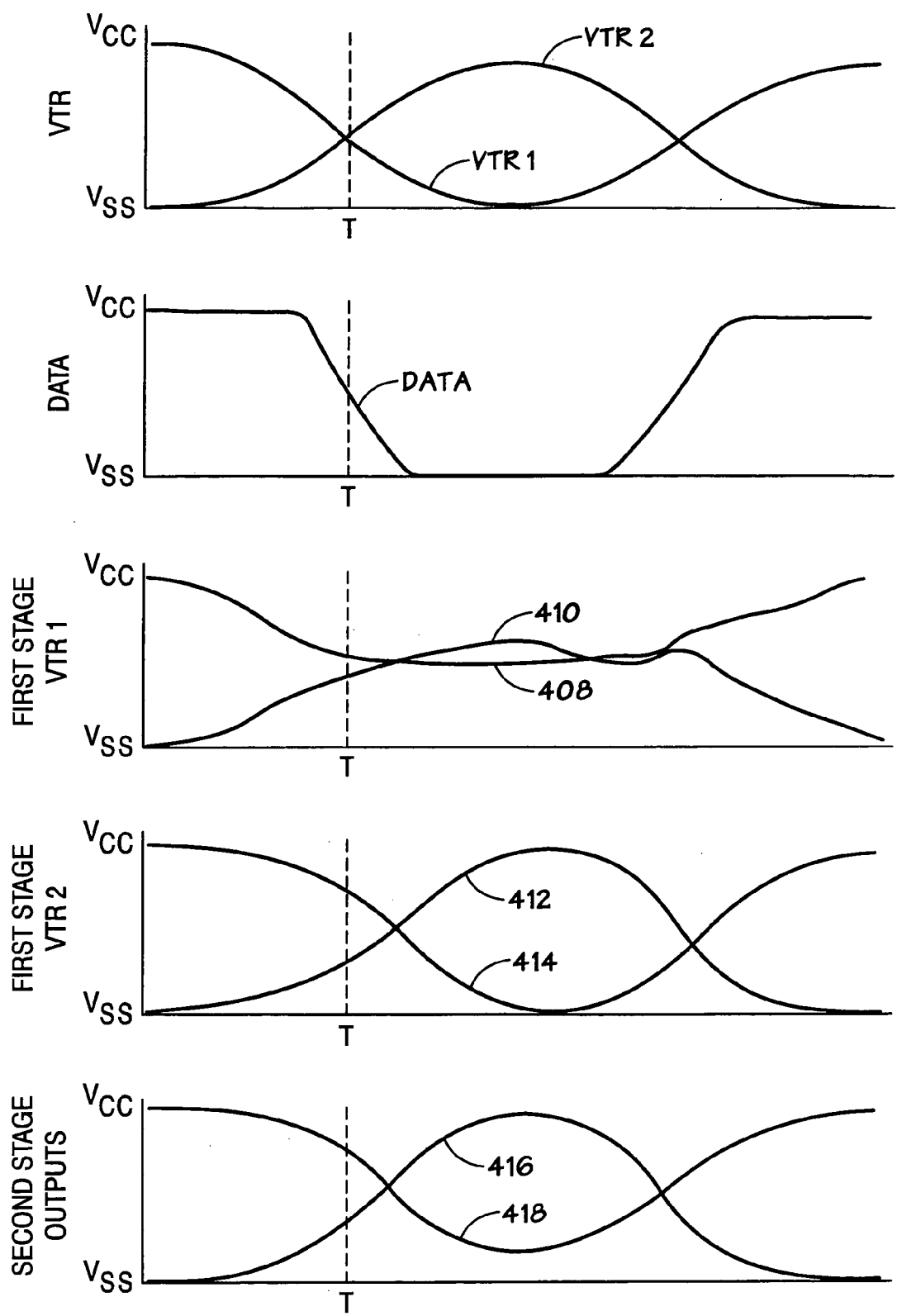
FIGS. 4A–4D illustrate groups timing diagrams depicting the operation of the exemplary embodiment of the two-stage amplifier in FIG. 3 in accordance with aspects of the present technique.

In FIG. 4A, a group of graphs corresponding to the data signal DATA being "0," VTR signal VTR1 being "0," and the complimentary VTR signal VTR2 being "1," after the time T. As shown in the First Stage VTR1 graph, when the data signal DATA changes to "0," the differential between a signal 408 that is provided from first comparator 302 and a signal 410 that is provided from third comparator 306 is indeterminate because the signals 408 and 410 are roughly equal. Conversely, in the First Stage VTR2 graph, a signal 412 that is provided from second comparator 304 and a signal 414 that is provided from fourth comparator 308 are clearly differential. These signals 408–414 are provided to the two-channel comparators 310 and 312. As a result, in the Second Stage graph, a signal 416 is provided from the first two-channel comparator 310 and a signal 418 is provided from second two-channel comparator 312, which are clearly differential. Accordingly, with the data signal DATA and the VTR signal VTR1 being "0," the signals 416 and 418, which are produced from the second stage two-channel comparators 310 and 312, may correspond to the data signal DATA and the complimentary VTR signal VTR2 because these signals are complimentary signals.

Figure 4B:
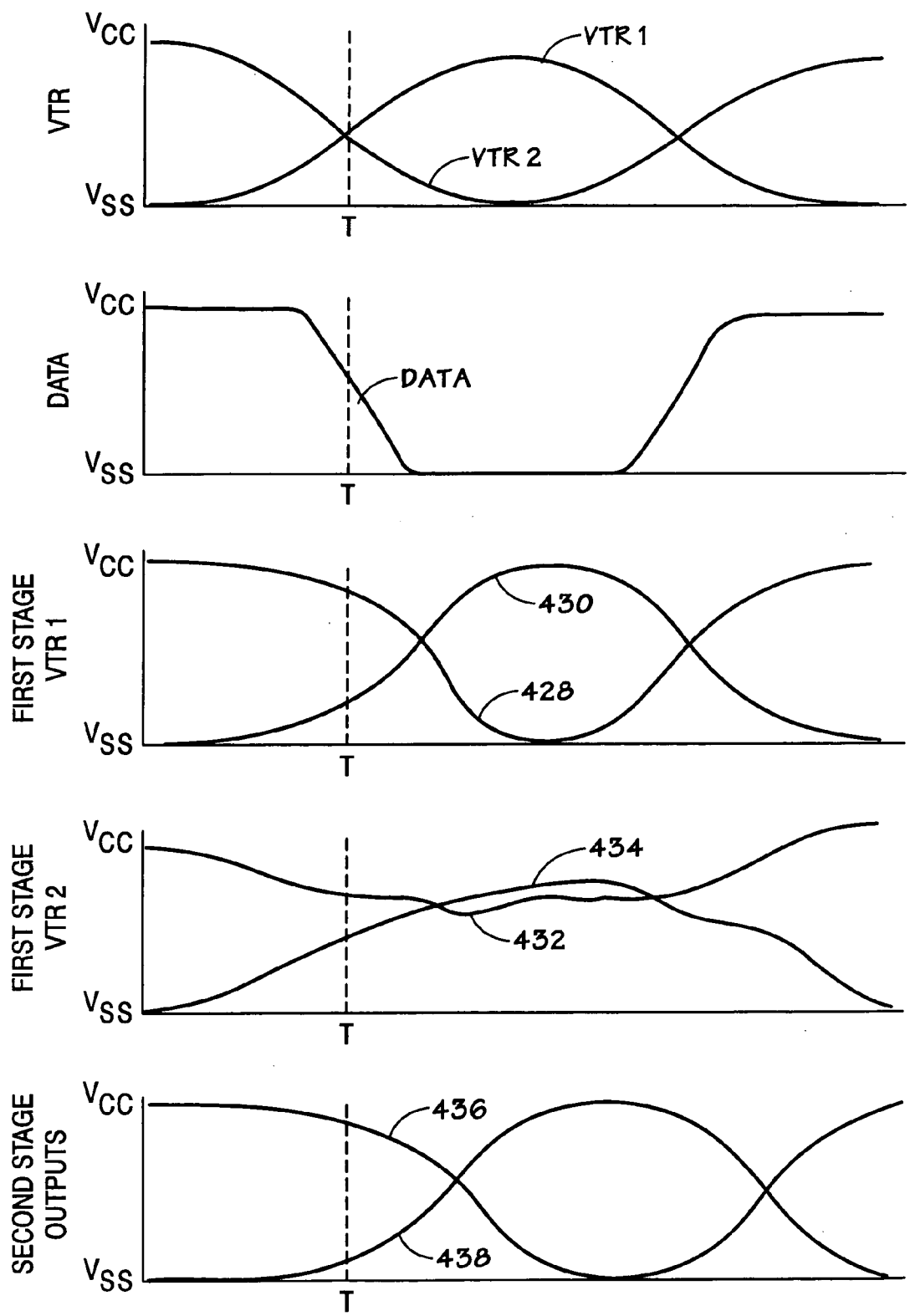

In FIG. 4B, a group of graphs corresponding to the data signal DATA being a "0," the VTR signal VTR1 being a "1," and the complimentary VTR signal VTR2 being a "0," after a time T. In the First Stage VTR1 graph, a signal 428 is generated from first comparator 302 and a signal 430 is generated from the third comparator 306, which are clearly differential signals. However, in the First Stage VTR2 graph, a signal 432 is provided from the second comparator 304 and a signal 434 is provided from the fourth comparator 308, which are roughly equal signals. As a result, in a Second Stage graph, a signal 436 is provided from the first two-channel comparator 310 and a signal 438 is provided from the second two-channel comparator 312, which are clearly differential signals. With the data signal DATA being "0" and the VTR signal VTR1 being "1," the signals 436 and 438 produced from the second stage two-channel comparators 310 and 312 may correspond to the data signal DATA and the VTR signal VTR1 because these signals are differential signals.

Figure 4C:
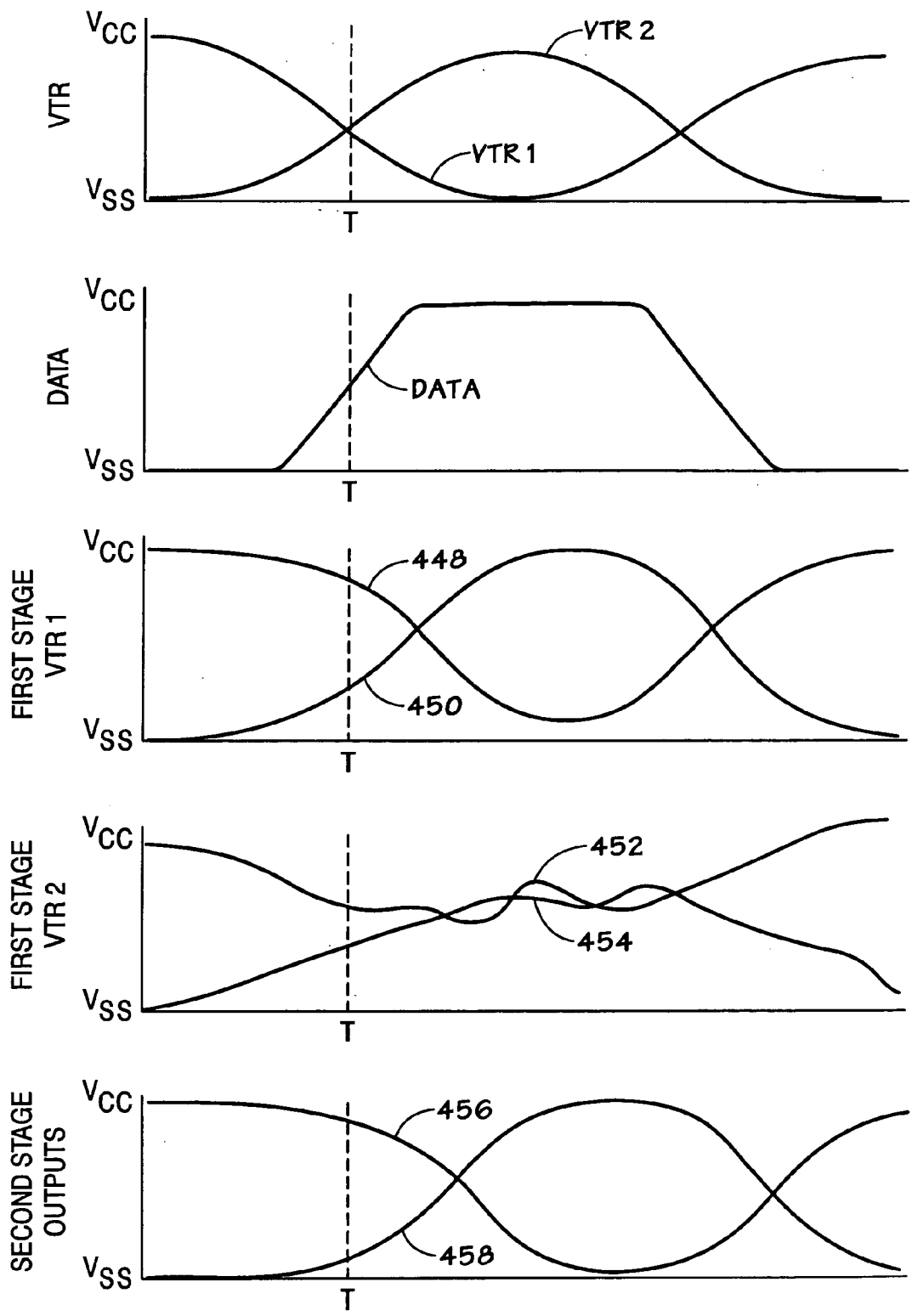

In FIG. 4C, a group of graphs corresponding to the data signal DATA being "1," the VTR signal VTR1 being "0," and the complimentary VTR signal VTR2 being "1," after a time T. Similar to the graphs in FIG. 4B, a signal 448 from the first comparator 302 and a signal 450 from the third comparator 306 are clearly differential, while a signal 452 from the second comparator 304 and a signal 454 from the fourth comparator 308 are roughly equal. As a result, a signal 456 from the first two-channel comparator 310 and a signal 458 from the second two-channel comparator 312 may correspond to the data signal DATA and the VTR signal VTR1, which provide stronger differential signals.

Figure 4D:
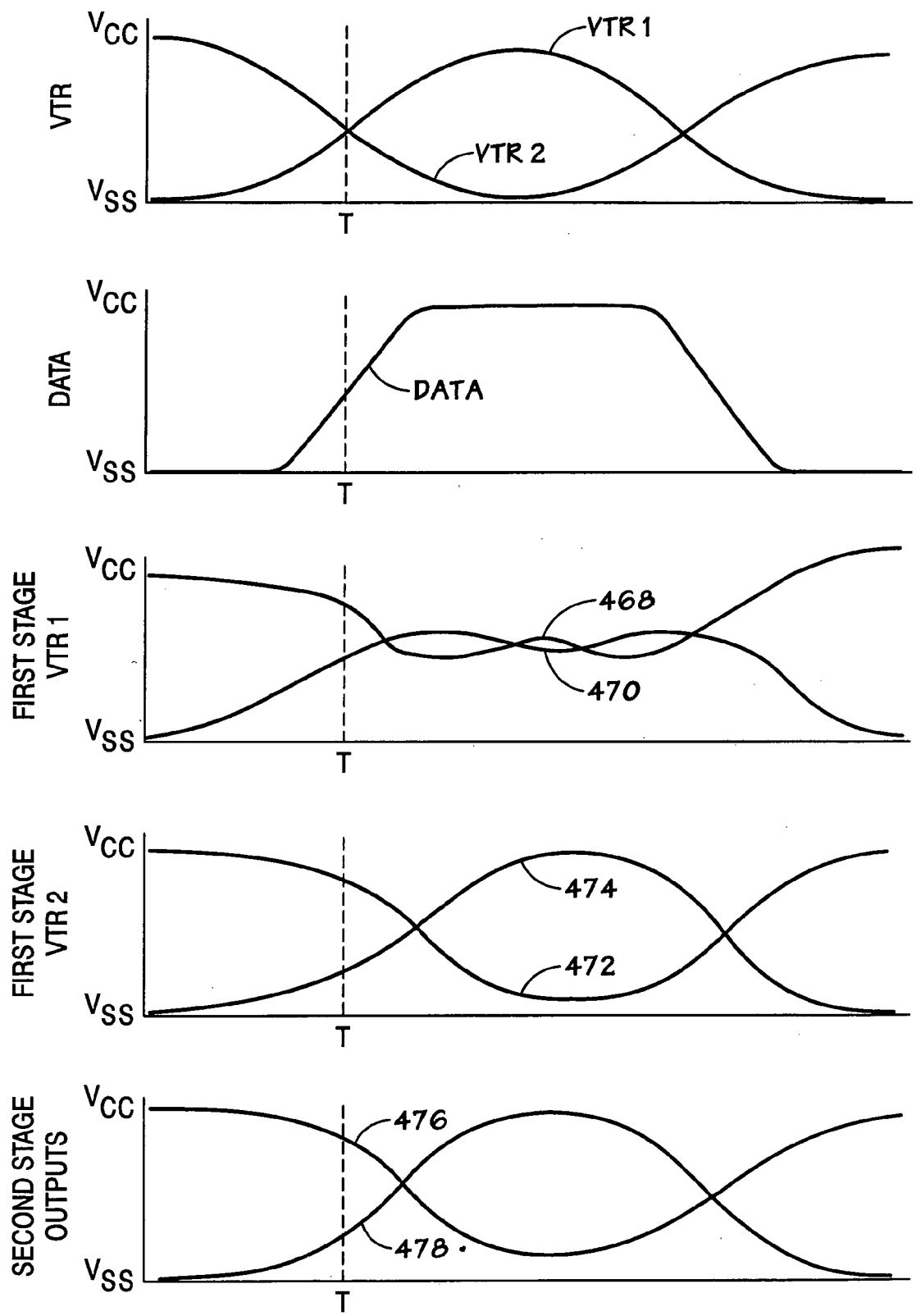

In FIG. 4D, another group of graphs corresponding to the data signal DATA being "1," the VTR signal VTR1 being "1," and the complimentary VTR signal VTR2 being "0," after a time T. Similar to the discussion regarding FIG. 4A, a signal 468 from the first comparator 302 and a signal 470 from the third comparator 306 are roughly equal, while a signal 462 from the second comparator 304 and a signal 464 from the fourth comparator 308 are clearly differential. As a result, a signal 476 from the first two-channel comparator 310 and a signal 478 from the second two-channel comparator 312 may correspond to the data signal DATA and the complimentary VTR signal VTR2, which provide the differential signals.

Figure 5:
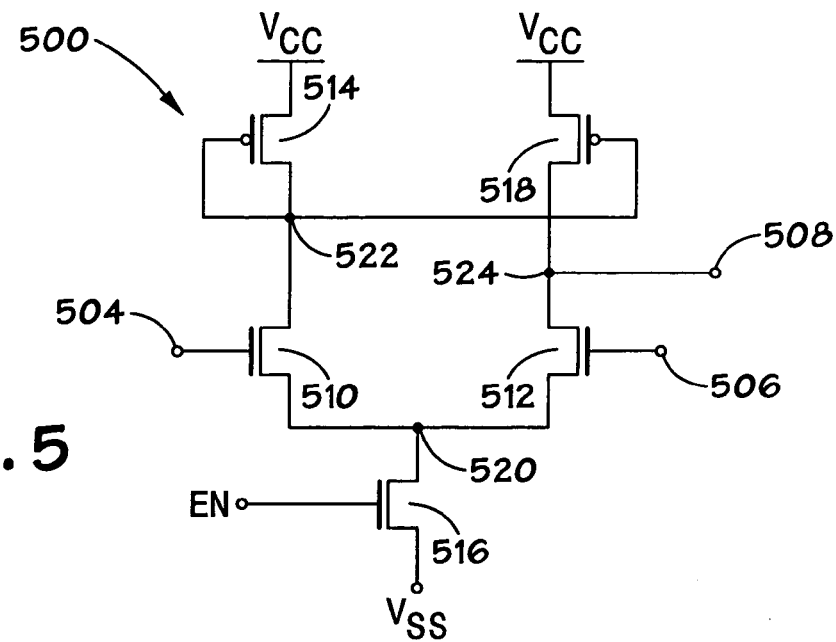
FIG. 5 illustrates a schematic diagram of an exemplary first stage amplifier in the two-stage amplifier of FIG. 3 in accordance with aspects of the present technique.

As discussed in FIGS. 3 and 4A–4D, the first stage of the switching device 300 includes four comparators 302, 304, 306, and 308. A more detailed description of exemplary embodiments of the comparators 302, 304, 306, and 308 is shown in FIG. 5. In this embodiment, a first stage amplifier 500 may be one of the comparators 302, 304, 306, and 308 of FIG. 3. As will be appreciated by those skilled in the art, other amplifiers may be implemented in accordance with the present technique as well. The first stage amplifier 500 may be coupled to the respective input signals, such as the data signal DATA and either the VTR signal VTR1 or the complimentary VTR signal VTR2. The first stage amplifier 500 may provide the output to the second stage two-channel comparators 310 and 312. The input signals are delivered to the input terminals of the first stage amplifier 500, which include a first input terminal 504 and a second input terminal 506. The first stage amplifier 500 may compare the input signals received at the input terminals 504 and 506 to produce an output signal at an output terminal 508.

To provide the output signal, the first input terminal 504 is connected to a gate of a first transistor 510, while the second input terminal 506 is connected to a gate of a second transistor 512, which receive the input signals. The first transistor 510 may be coupled in series between a third transistor 514 that is connected to a first voltage source $V_{cc}$ and a fourth transistor 516 that is connected to a second voltage source $V_{ss}$ via the respective sources and drains. The second voltage source $V_{ss}$ may be ground or a voltage source of lower potential than the first voltage source $V_{cc}$. The second transistor 512 may be coupled in series between a fifth transistor 518 that is connected to the first voltage source $V_{cc}$ and the fourth transistor 516 via the respective sources and drains. The first transistor 510, the second transistor 512 and the fourth transistor 516 are coupled together at a node 520. The gates of the third transistor 514 and the fifth transistors 518 are coupled together between the first transistor 510 and the third transistor 514 at a node 522. The output terminal 508 is connected between the second transistor 512 and the fifth transistor 518 at a node 524. Also, as another input, an enable signal EN may be applied to a gate of the fourth transistor 516 to control the operation of the first stage amplifier 500.

To operate the first stage amplifier 500, a "low" or "high" enable signal EN may be applied to the gate of the fourth transistor 516. By applying a "low" enable signal EN, no output signal is generated at the output terminal 508. However, if a "high" enable signal EN is applied to the gate of the fourth transistor 516, then the first stage amplifier 500 may produce various signals based on the input signals being applied to the input terminals 504 and 506. By applying various signal combinations, the first stage amplifier 500 may generate one of the signals in the First Stage VTR1 graph or First Stage VTR2 graph (FIGS. 4A–4D), as discussed above.

As an example of a specific embodiment, the first transistor 510, the second transistor 512, and the fourth transistor 516 may be NMOS transistors, while the third transistor 514 and the fifth transistors 518 may be PMOS transistors. From the first stage amplifier 500, three general types of signals may be produced. First, if the voltage applied to the first input terminal 504 is "high" and the voltage applied to the second input terminal 506 is "low," then the signal on the output terminal 508 is "high" because more current flows across the fifth transistor 518. Secondly, if the voltage applied to the first input terminal 504 is "low" and the voltage applied to the second input terminal 506 is "high," then the signal on the output terminal 508 is "low" because more current flows across the third transistor 514. Finally, if the voltages applied to the first input terminal 504 and to the second input terminal 506 are both "low" or "high," then the signal on the output terminal 508 is "indeterminate" because the current flow across the third transistor 514 and the fifth transistor 518 is approximately equal. In this final situation, the signal at the output terminal 508 is neither "low" nor "high," but is "indeterminate" because it is between the two levels.

Figure 6:
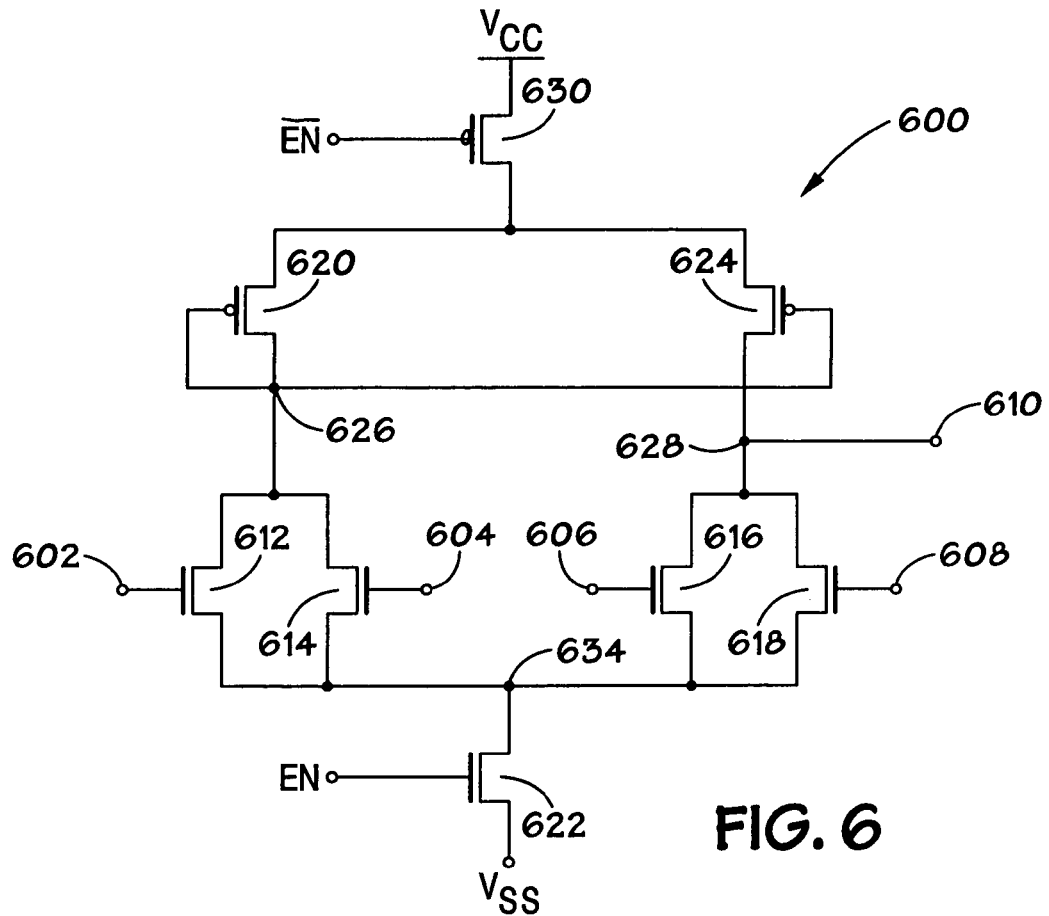
FIG. 6 illustrates a schematic diagram of a second stage amplifier in the two-stage amplifier of FIG. 3 in accordance with aspects of the present technique.

With regard to the second stage of the switching device, as discussed above in FIG. 3, each of the outputs of the four comparators 302, 304, 306, and 308 is connected to either a positive or negative terminal of the two-channel comparators 310 and 312. A more detailed description of one of the two-channel comparators 310 and 312 is shown in FIG. 6. In this embodiment, a second stage amplifier 600 may be one of the two-channel comparators 310 or 312. Accordingly, the output signals of the comparators 302, 304, 306 and 308 are routed to the respective input terminals of the second stage amplifier 600. The input terminals of the second stage amplifier 600 include a first input terminal 602, a second input terminal 604, a third input terminal 606, and a fourth input terminal 608. Once the input signals are received, the second stage amplifier 600 may compare the input signals to produce an output signal at the output terminal 610, as discussed above with regard to FIGS. 3 and 4A–4D.

To provide an output signal, the output signals from the comparators 302, 304, 306, and 308 may connect to the input terminals 602–608. The first input terminal 602 may be connected to a gate of a first transistor 612, while the second input terminal 604 may be connected to a gate of a second transistor 614. Likewise, the third input terminal 606 may be connected to a gate of a third transistor 616, while the fourth input terminal 608 may be connected to a gate of a fourth transistor 618. The first transistor 612 and the second transistor 614 may be connected in parallel across each drain and source. Similarly, the third transistor 616 and fourth transistor 618 may also be connected in parallel across each drain and source. The first transistor 612 and the second transistor 614 may be coupled in series between a fifth transistor 620 and a first enable transistor 622 via the respective sources and drains. The third transistor 616 and the fourth transistor 618 may be coupled in series between a sixth transistor 624 and the first enable transistor 622 via the respective sources and drains. The first transistor 612, the second transistor 614, the third transistor 616, the fourth transistor 618, and the first enable transistor 622 are coupled together at a node 634. The gates of the fifth transistor 620 and the sixth transistor 624 are coupled together between the first transistor 612, the second transistor 614, and the fifth transistor 620 at a node 626. The output terminal 610, which delivers the output signal, may be connected between the third transistor 616, the fourth transistor 618, and the sixth transistor 624 at a node 628.

To control the operation of the second stage amplifier 600, the first enable transistor 622 may be connected between the second voltage source $V_{ss}$ and the transistors 612–618 at the node 634. The second voltage source $V_{ss}$ may be ground or a voltage source of lower potential than the first voltage source $V_{cc}$. A second enable transistor 630 may also be connected between the first voltage source $V_{cc}$, the fifth transistor 620, and the sixth transistor 624 at a node 632. An enable signal EN may be delivered to a gate of the first enable transistor 622 and a complimentary enable signal $\overline{EN}$ to a gate of the second enable transistor 630 to operate the second stage amplifier 600. The enable signal EN and the complimentary enable signal $\overline{EN}$ may permit the first voltage source $V_{cc}$ and the second voltage source $V_{ss}$ to be applied to the transistors 612–620 and 624.

The operation of the second stage amplifier 600 may depend on the signals that are delivered to the input terminals 602–608 and the gates of the first enable transistor 622 and the second enable transistor 630. For instance, a "low" enable signal EN may be applied to the gate of the first enable transistor 622 and a "high" complimentary enable signal $\overline{EN}$ may be applied to the gates of the second enable transistor 630, when the second stage amplifier 600 is not being utilized. By applying these signals to the respective enable transistors 622 and 630, no output signal is generated on the output terminal 610. However, if a "high" enable signal EN is applied to the gate of the first enable transistor 622 and a "low" complimentary enable signal $\overline{EN}$ is applied to the second enable transistor 630, then the second stage amplifier 600 may produce various signals that depend on the input signal that is received at the input terminals 602–608. With the enable EN signal being "high" and the complimentary enable signal $\overline{EN}$ being "low," the operation of the second stage amplifier 600 may generate signals similar to the signals produced in the Second Stage graphs of FIGS. 4A–4D.

As an example of a specific embodiment of the second stage amplifier 600, the first transistor 612, the second transistor 614, the third transistor 616, the fourth transistor 618, and the first enable transistor 622 may be NMOS transistors. Likewise, the fifth transistor 620, the sixth transistors 624 and the second enable transistor 630 may be PMOS transistors. With the second stage amplifier 600, four different situations produce output signals. First, if the voltage applied to the first input terminal 602 and the fourth input terminal 608 is about the same, the voltage applied to the third input terminal 606 is "high," and the voltage applied to the second input terminal 604 is "low," then the signal at the output terminal 610 may be "low." This results from more current flowing across the third transistor 616 than the second transistor 614. Secondly, if the voltage applied to the second input terminal 604 and the third input terminal 606 is about the same, the voltage applied to the fourth input terminal 608 is "high," and the voltage applied to the first input terminal 602 is "low," then the signal at the output terminal 610 may be "low." This results from more current flowing across the fourth transistor 618 than the first transistor 612. Thirdly, if the voltage applied to the second input terminal 604 and the third input terminal 606 is about the same, the voltage applied to the first input terminal 602 is "high," and the voltage applied to the fourth input terminal 608 is "low," then the signal at the output terminal 610 may be "high." This results from more current flowing across the first transistor 612 than the fourth transistor 618. Finally, if the voltage applied to the first input terminal 602 and the fourth input terminal 608 is about the same, the voltage applied to the second input terminal 604 is "high," and the voltage applied to the third input terminal 606 is "low," then the signal at the output terminal 610 may be "high." This results from more current flowing across the second transistor 614 than the third transistor 616.

Figure 3:
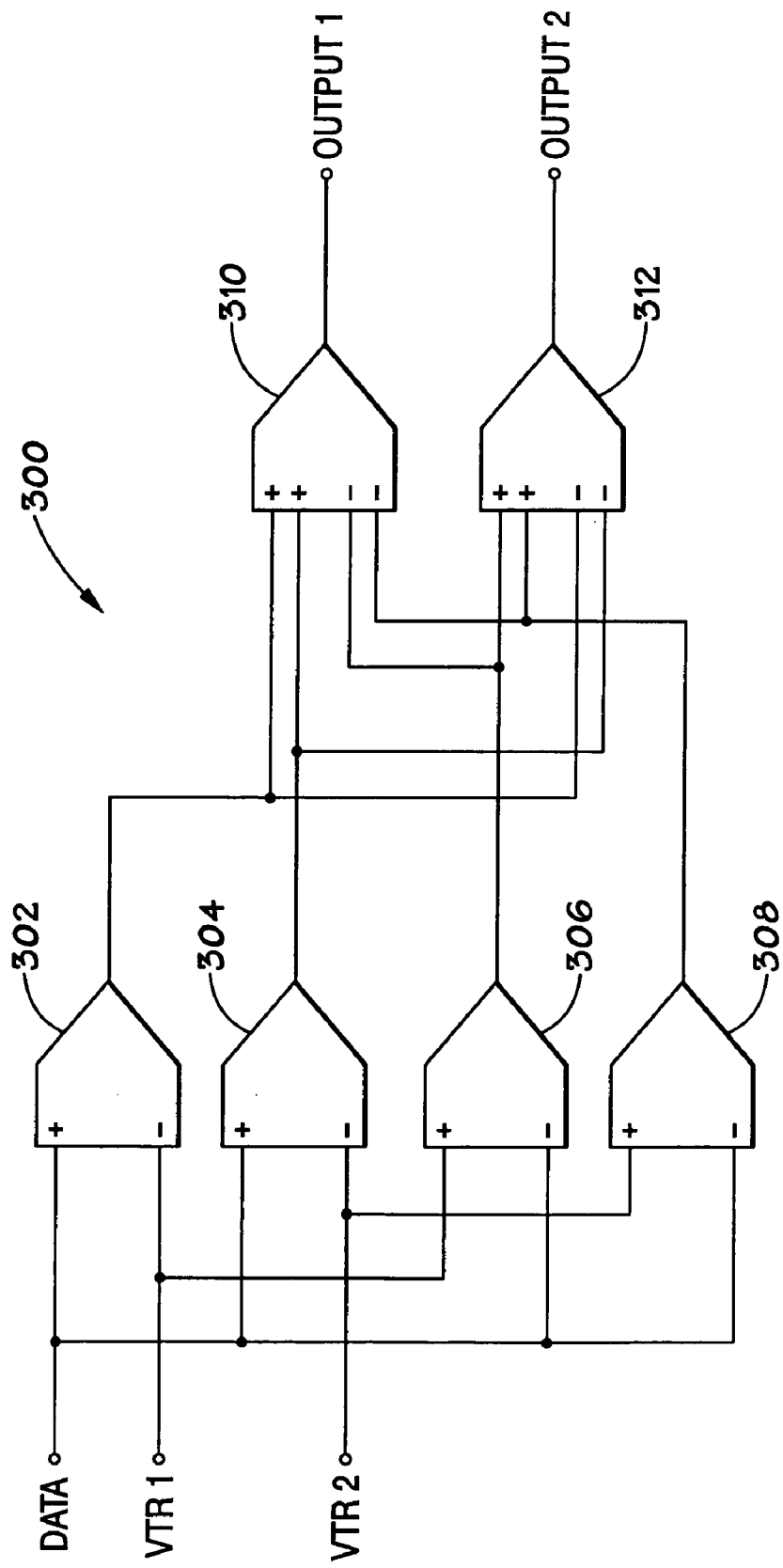
FIG. 3 illustrates a block diagram of an exemplary embodiment of a two-stage amplifier used in the memory device of FIG. 2 in accordance with aspects of the present technique.

Beneficially, the second stage amplifier 600 is able to produce a "high" or "low" signal based on the input signals received. By configuring a pair of second stage amplifiers to have the input signals reversed, as shown in FIG. 3, the second stage amplifiers are able to provide differential signals from the input signals in each situation. As a result, the use of the two second stage amplifiers 600 may minimize the timing issues that are present in other switching techniques, while also minimizing symmetry issues as well.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
    a processor; and
    a memory device coupled to the processor that comprises:
        a memory array; and
        a buffer device comprising:
            a plurality of comparators, wherein each of the plurality of comparators is adapted to receive a data signal and one of a first signal and a second signal, wherein the second signal is a complimentary signal of the first signal; and
            a plurality of two channel comparators adapted to receive a plurality of output signals from the plurality of comparators and to produce a first output signal and a second output signal with the second output signal being a complimentary signal of the first output signal.

2. The system, as set forth in claim 1, wherein the memory device comprises a dynamic random access memory.

3. The system, as set forth in claim 1, wherein the memory device comprises a static random access memory.

4. The system, as set forth in claim 1, wherein the processor is coupled to a communication port.

5. The system, as set forth in claim 1, wherein the processor is coupled to an input device.

6. The system, as set forth in claim 1, wherein the processor is coupled to a display.

7. The system, as set forth in claim 1, wherein the memory device comprises a pin adapted to receive the data signal.

8. The system, as set forth in claim 7, wherein the processor transmits the data signal through the pin to the buffer device.

9. The system, as set forth in claim 1, wherein the data signal comprises control information.

10. The system, as set forth in claim 1, wherein the data signal comprises address information.

11. The system, as set forth in claim 1, wherein each of the plurality of comparators comprises a differential amplifier.

12. The system, as set forth in claim 1, wherein each of the plurality of two channel comparators comprises a two channel differential amplifier.

13. The system, as set forth in claim 1, wherein the first signal is a clock signal.

14. An input buffer comprising:
    a plurality of comparators, wherein each of the plurality of comparators is adapted to receive a data signal and one of a first signal and a second signal, wherein the second signal is a complimentary signal of the first signal; and
    a plurality of two channel comparators adapted to receive a plurality of output signals from the plurality of comparators and to produce a first output signal and a second output signal with the second output signal being a complimentary signal of the first output signal.

15. The input buffer, as set forth in claim 14, wherein each of the plurality of comparators comprises a differential amplifier.

16. The input buffer, as set forth in claim 14, wherein each of the plurality of two channel comparators comprises a two channel differential amplifier.

17. The input buffer, as set forth in claim 14, wherein the data signal comprises control information.

18. The input buffer, as set forth in claim 14, wherein the data signal comprises address information.

19. The input buffer, as set forth in claim 14, wherein the plurality of comparators comprises:
    a first comparator adapted to:
        receive the data signal at a positive input terminal;
        receive the first signal at a negative input terminal; and
        produce a first comparator output signal;
    a second comparator adapted to:
        receive the data signal at a positive input terminal;
        receive the second signal at a negative input terminal; and
        produce a second comparator output signal;
    a third comparator adapted to:
        receive the first signal at a positive input terminal;
        receive the data signal at a negative input terminal; and
        produce a third comparator output signal; and
    a fourth comparator adapted to:
        receive the second signal at a positive input terminal;
        receive the data signal at a negative input terminal; and
        produce a fourth comparator output signal.

20. The input buffer, as set forth in claim 19, wherein the plurality of two channel comparators comprises:
    a first two-channel comparator adapted to:
        receive the first comparator output signal at a first positive input terminal;
        receive the second comparator output signal at a second positive input terminal;
        receive the third comparator output signal at a first negative input terminal;

receive the fourth comparator output signal at a second negative input terminal; and produce the first output signal; and a second two-channel comparator adapted to:
receive the third comparator output signal at a first positive input terminal;
receive the fourth comparator output signal at a second positive input terminal;
receive the first comparator output signal at a first negative input terminal; and
receive the second comparator output signal at a second negative input terminal; and
produce the second output signal.

21. A memory device comprising:
a memory array;
a plurality of sense amplifiers coupled to the memory array; and
a buffer device couple to the memory array, the buffer device comprising:
a plurality of comparators, wherein each of the plurality of comparators is adapted to receive a data signal and one of a first signal and a second signal, wherein the second signal is a complimentary signal of the first signal; and
a plurality of two channel comparators adapted to receive a plurality of output signals from the plurality of comparators and to produce a first output signal and a second output signal with the second output signal being a complimentary signal of the first output signal.

22. The memory device, as set forth in claim 21, wherein the memory device is a dynamic random access memory device.

23. The memory device, as set forth in claim 21, wherein the memory device is a static random access memory device.

24. The memory device, as set forth in claim 21, wherein the data signal comprises control information.

25. The memory device, as set forth in claim 21, wherein the data signal comprises address information.

26. The memory device, as set forth in claim 21, wherein the first signal is a clock signal.

27. The memory device, as set forth in claim 21, comprising a pin coupled to the buffer device for receiving the data signal.

28. The memory device, as set forth in claim 21, wherein each of the plurality of comparators is a differential amplifier.

29. The memory device, as set forth in claim 28, wherein each differential amplifier comprises:
a first input terminal coupled to a gate of a first transistor, the first transistor being coupled in series between a third transistor that is connected to a first voltage source and a fourth transistor that is coupled to a second voltage source, wherein a gate of the fourth transistor is coupled to an enable signal;
a second input terminal coupled to a gate of a second transistor, the second transistor being coupled in series between a fifth transistor that is connected to a third voltage source and the fourth transistor, wherein a gate of the third transistor and the fifth transistor are coupled between the third transistor and the first transistor; and
an output terminal that is coupled between the second transistor and the fifth transistor.

30. The memory device, as set forth in claim 21, wherein each of the plurality of two channel comparators is a two channel differential amplifier.

31. The memory device, as set forth in claim 30, wherein each two channel differential amplifier comprises:
a first input terminal coupled to a gate of a first transistor, the first transistor being coupled in parallel with a second transistor;
a second input terminal coupled to a gate of the second transistor, the first transistor and the second transistor being coupled in series with a third transistor and a fourth transistor;
a third input terminal coupled to a gate of a fifth transistor, the fifth transistor being coupled in parallel with a sixth transistor;
a fourth input terminal coupled to a gate of the fourth transistor, the third transistor and the fourth transistor being coupled in series with the fourth transistor and a seventh transistor, wherein a gate of the third transistor and a gate of the seventh transistor are coupled between the first transistor, the second transistor and the third transistor;
a first enable terminal coupled to a gate of an eighth transistor, the eighth transistor being coupled in series between a first voltage source and the third transistor and the seventh transistor;
a second enable terminal coupled to a gate of the fourth transistor, the fourth transistor being coupled between a second voltage source and the first transistor, the second transistor, the fifth transistor, and the sixth transistor; and
an output terminal that is coupled between the fifth transistor, the sixth transistor and the seventh transistor.

32. A method of operating a buffer, the method comprising the acts of:
receiving a data signal at each of a plurality of comparators;
receiving one of a first signal and a second signal at each of the plurality of comparators, wherein the second signal is a complimentary signal of the first signal;
generating a respective one of a plurality of output signals from each of the plurality of comparators;
receiving each of the plurality of output signals at each of a plurality of two channel comparators;
generating a first output and a second output from the plurality of two channel comparators, wherein the second output signal is a complimentary signal of the first output signal.

33. The method, as set forth in claim 32, wherein the act of receiving the data signal comprises receiving control information.

34. The method, as set forth in claim 32, wherein the act of receiving the data signal comprises receiving address information.

35. The method, as set forth in claim 32, wherein the first signal is a clock signal.

36. The method, as set forth in claim 32, wherein each of the plurality of comparators comprises a differential amplifier.

37. The method, as set forth in claim 32, wherein each of the plurality of two channel comparators comprises a two channel differential amplifier.

* * * * *